(12) United States Patent
Takahashi et al.

(10) Patent No.: US 7,560,955 B2
(45) Date of Patent: Jul. 14, 2009

(54) LOGIC CIRCUIT

(75) Inventors: Hiroyuki Takahashi, Kawasaki (JP); Susumu Takano, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 30 days.

(21) Appl. No.: 11/285,285

(22) Filed: Nov. 23, 2005

(65) Prior Publication Data
US 2006/0109029 A1 May 25, 2006

(30) Foreign Application Priority Data
Nov. 24, 2004 (JP) ............................. 2004-339340

(51) Int. Cl.
*G06F 7/50* (2006.01)
*H03K 19/20* (2006.01)
(52) U.S. Cl. ................ 326/52; 326/55; 326/104; 326/112; 326/113; 326/114; 326/119; 326/121
(58) Field of Classification Search ............... 326/52, 326/55, 104, 112, 113, 114, 119, 121
See application file for complete search history.

(56) References Cited

U.S. PATENT DOCUMENTS

| | | | |
|---|---|---|---|
| 5,523,707 A | 6/1996 | Levy et al. | |
| 6,724,225 B2 * | 4/2004 | Joshi et al. | .......... 326/113 |
| 7,176,746 B1 * | 2/2007 | Wang et al. | .......... 327/536 |
| 2004/0004499 A1 * | 1/2004 | Yonemaru | .......... 326/113 |

FOREIGN PATENT DOCUMENTS

| | | |
|---|---|---|
| EP | 1 111 791 | 6/2001 |
| EP | 0 605 253 | 9/2002 |
| JP | 60-206222 | 10/1985 |
| JP | A-23144 | 1/1990 |

OTHER PUBLICATIONS

"Error Correction Code and its Application", edited by Picture Information Media Association, (supervised by Y. Etoh and T.Kaneko), pp. 26 and 34, published by OHM Co. Ltd., on Jul. 20, 2001.

* cited by examiner

Primary Examiner—Vibol Tan
Assistant Examiner—Thienvu V Tran
(74) Attorney, Agent, or Firm—Young & Thompson (57) ABSTRACT

Disclosed is a logic circuit including first and second input terminals, supplied with respective logic signals, and first and second MOS transistors, having sources respectively connected to associated ones of the first and second input terminals and gates cross-connected to the second and first input terminals. The drains of the first and second MOS transistors are connected in common. The logic circuit also includes a MOS transistor, connected between a first power supply and a common node of the drains of the first and second MOS transistors and having a gate supplied with a reset signal so that the MOS transistor is turned on at the time of resetting. The logic circuit further includes an inverter having an input end connected to the common node.

8 Claims, 8 Drawing Sheets

LOW LEVEL AT THE TIME OF RESETTING

HIGH LEVEL AT THE TIME OF RESETTING

LOGIC CIRCUIT

FIELD OF THE INVENTION

This invention relates to a logic circuit and, more particularly, to a logic circuit applicable to a data compare circuit and a coincidence detection circuit.

BACKGROUND OF THE INVENTION

Figure 6:
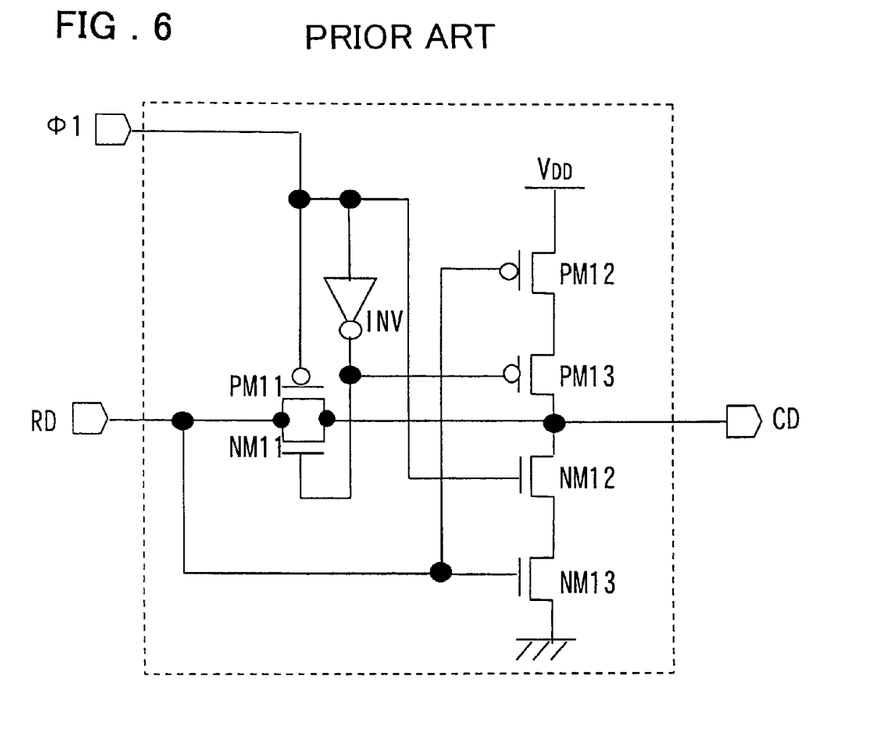
FIG. 6 is a diagram illustrating the configuration of a conventional Ex-OR circuit.

FIG. 6 is a diagram illustrating a circuit configuration of a conventional compare decision circuit (exclusive OR circuit) (see Patent Document 1 below). This circuit is designed to resolve the problem proper to an exclusive-OR circuit which is consisted by plural stages of gate circuits, such as NOR gates or AND gates, that propagation delay is elongated such that the demand for high operating speed cannot be coped with. This prior-art circuit includes a transfer gate composed by an nMOS transistor NM11 and a pMOS transistor PM11 which are connected in parallel between an input terminal RD and an output terminal CD, and which are supplied at gate terminals thereof with a compare data signal φ 1 and an inverted signal of the compare data signal φ 1, obtained by an inverter INV, respectively for being on-off controlled. The circuit also includes a pMOS transistor PM12 which has a source connected to a power supply VDD and has a gate connected to the input terminal RD, and a pMOS transistor PM13 which has a source, a gate and a drain connected to the drain of the pMOS transistor PM12, to an output of the inverter INV and to the output terminal CD, respectively. The circuit further includes an NMOS transistor NM12 which has a drain connected to the output terminal CD and has a gate connected to the input terminal of the compare data signal φ 1, and an nMOS transistor NM13 which has a source, a drain and a gate connected to the ground, to the source of the nMOS transistor NM12 and to the input terminal RD respectively. The circuit shown in FIG. 6 implements the operating function of the exclusive OR of CD=XOR (φ 1, RD).

That is, when the compare data signal φ 1 is at a low level and the input terminal RD is at a low level, the transistors PM11 and NM11, constituting the transfer gate, are turned on, and the output terminal CD is set to a low level At this time, the transistors PM13, NM12 and NM13 are in an off state.

When the compare data signal φ 1 is at a low level, and the input terminal RD is at a high level, the transistors PM11 and NM11 constituting the transfer gate, are turned on to set the output terminal CD to a high level. At this time, the transistors PM12, PM13 and NM12 are in an off state.

When the compare data signal φ 1 is at a high level, and the input terminal RD is at a low level, the transistors PM11 and NM11, constituting the transfer gate, are in an off state, whilst the transistor PM12 and PM13, connected between the output terminal CD and a power supply VDD, are turned on and the transistor NM13 inserted in the path between the output terminal CD and the ground GND is turned off to set the output terminal CD to a high level.

When the compare data signal φ 1 is at a high level, and the input terminal RD is at a high level, the transistors PM11 and NM11, constituting the transfer gate, are turned off, whilst the transistor PM12 and PM13, connected between the output terminal CD and the power supply VDD, are turned off, and the transistors NM12 and NM13, connected between the output terminal CD and the ground GND, are turned off to set the output terminal CD to a low level.

[Patent Document 1]

JP Patent Kokai Publication No. JP-A-2-3144 (FIG. 1)

[Non-Patent Document]

'Error Correction Code and its Application', edited by Picture Information Media Association, supervised by Y. Etoh and T.Kaneko, pages 26 and 34, published by OHM Co. Ltd., on Jul. 20, 2001.

SUMMARY OF THE DISCLOSURE

Figure 7A:
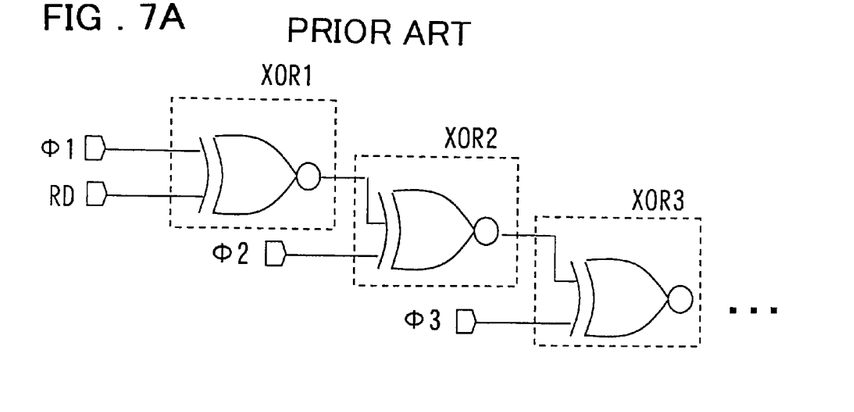
FIG. 7A is a diagram illustrating the configuration comprising plural stages of exclusive-OR circuits of FIG. 6 connected in tandem and FIG. 7B illustrates the state in which the compare signal $\phi 1$ is at a high level.
Figure 7B:
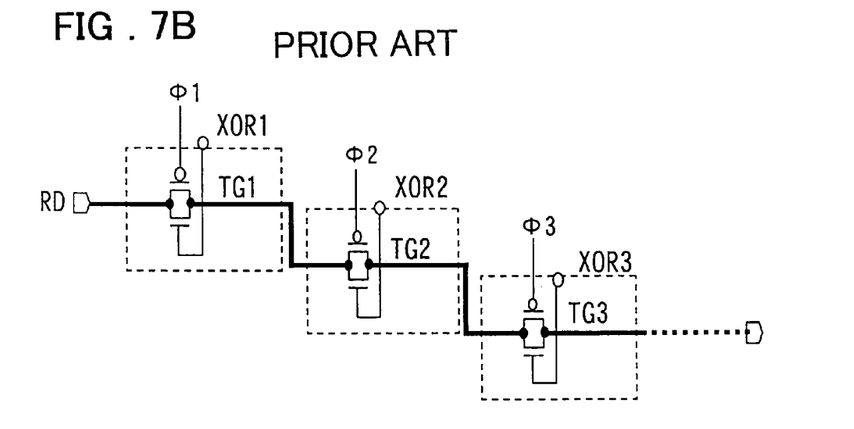
Figure 8:
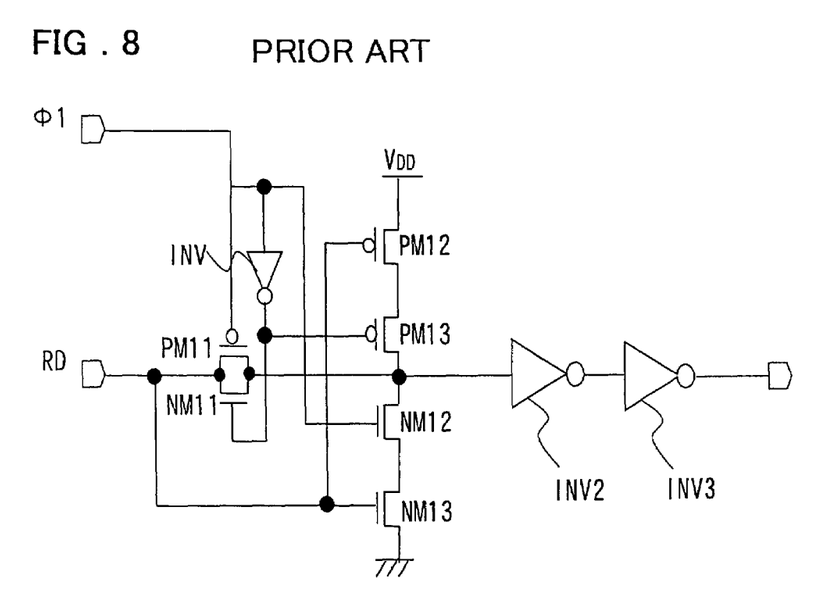
FIG. 8 is a diagram illustrating a modification of the circuit of FIG. 6.

Meanwhile, in the exclusive-OR circuit, shown in FIG. 6, when the compare data signal φ 1 is at a low level, the transfer gate, constituted by the complementary transistors PM11 and NM11 are turned on, so that the input terminal RD and the output terminal CD are electrically connected to each other. Thus, in a circuit comprising plural stages of exclusive-OR circuits arrayed in cascade connection as shown for example in FIG. 7A, in which each exclusive-OR circuit is of the configuration shown in FIG. 6, if the compare signals φ 1, φ 2, φ 3, . . . , are all at a low level, the signal path made up of the exclusive-OR circuits XOR1, XOR2, XOR3, . . . , with respective transfer gates TG1, TG2, TG3 . . . , being set in an on state, appears to the input terminal RD of the exclusive-OR circuit XOR1 of the first stage as if the signal path is a long load, that is, the load becomes larger. This increases the signal propagation delay time. Hence, it becomes necessary to arrange a non-inverting buffer circuit comprising two-stages of inverters INV2 and INV3 as shown in FIG. 8, at the output stage of the circuit of FIG. 6. Meanwhile, the three-stage circuit of XOR1, XOR2 and XOR3 in FIG. 7A constitute a four-input coincidence detection circuit. Also, the transfer gates TG1, TG2 and TG3 of FIG. 7B correspond to the transfer gate (PM11, NM11) of FIG. 6.

However, in case the buffer circuit is arranged in the output stage of the exclusive-OR circuit, as shown in FIG. 8, and a plural number of stages of the exclusive-OR circuits are arrayed in cascade connection, as in the case of an ECC (Error Correcting Circuit), the propagation delay time is increased by at least two inverter stages, as a result of which, it becomes extremely difficult to cope successfully with the increase in the operating speed. It is noted that an encoder or a decoder for parity check codes (ECC circuit) is made up by plural stages each composed of plural exclusive-OR circuits (see the Patent Document 1).

In the circuit shown in FIG. 6, the propagation delay time differs with change in the signal φ 1 supplied as one input of the two-input exclusive-OR circuit, change in the other input RD of the two-input exclusive-OR circuit, or changes of both the two input signals to the two-input exclusive-OR circuit, that is, φ 1 and RD, thus producing the skew.

There has been a demand of reducing the propagation delay time of the logic circuit for coping with the demand for a high operating speed.

Suppression of the skew is also required in a logic circuit, such as a coincidence detection shown in FIG. 6.

The present invention disclosed in the present application are as follows:

A logic circuit in accordance with one aspect of the present invention comprises: a plurality of input terminals for receiving logic signals, respectively; and a plurality of transistors, each having a first signal terminal thereof connected to an associated one of said input terminals and having a control terminal thereof connected to one of said input terminals different from the input terminal to which said first signal terminal is connected.

Preferably, in the logic circuit according to the present invention, second signal terminals of said plurality of transistors are connected to a node (termed a 'common node'), either directly or through a further transistor. The logic circuit further comprises: a switch connected between said node and a first power supply, said switch being on-off controlled based on a signal supplied to a control terminal thereof; and an inverting circuit having an input connected to said common node and having an output connected to an output terminal of said logic circuit. Alternatively, the logic circuit further comprises a non-inverting circuit having an input end connected to the common node and an output end connected to an output terminal.

Preferably, in the logic circuit according to the present invention, second signal terminals of said plurality of transistors are connected to a node (termed a 'common node'), either directly or through said further transistor. The logic circuit further comprises a first group of switches connected in series between a first power supply and said common node, said first group of switches having control terminals supplied with signals from said input terminals respectively, for being on-off controlled.

Preferably, the logic circuit according to the present invention, further comprises second group of switches connected in series between said output terminal and said second power supply, said second group of switches having control terminals supplied with signals from said input terminals respectively, for being on-off controlled.

Preferably, the logic circuit according to the present invention, further comprises a third group of switches connected in parallel between the power supply side of the inverting circuit and said first power supply, said third group of switches having control terminals supplied with signals from said input terminals respectively for being on-off controlled.

Preferably, in the logic circuit according to the present invention, the second signal terminals of said plurality of transistors are connected in common to a node(termed a 'common node'). The logic circuit further comprises: a switch between said common node and a first power supply, said switch having a control terminal for receiving a reset signal, said switch being controlled on and off when said reset signal supplied to said control terminal is in an activated state and in an inactivated state, respectively; and an inverting or non-inverting circuit having an input end connected to said node and an output end connected to an output terminal of said logic circuit.

Preferably, in the logic circuit according to the present invention, the second signal terminals of the transistors are connected via further transistors to a node (termed a 'common node'), and control terminals of the further transistors are connected to input terminals different from the input terminals to which are connected first signal terminals of the transistors related to the further transistors. Preferably, the logic circuit further comprises a switch connected in series between the first power supply and the common node and adapted to be on-off controlled by having a reset signal supplied to a control terminal thereof. The control terminals of two complementary transistors, connected in series between the first power supply and the second power supply, are connected to the common node and to a terminal supplied with a complementary signal of the reset signal. Preferably, the logic circuit further comprises a plurality of switches connected in series between the first power supply and a connection node between the two complementary transistors and adapted to be on-off controlled by having signals from the input terminals supplied to control terminals thereof.

The meritorious effects of the present invention are summarized as follows.

According to the present invention, in which the number of stages has been reduced, the propagation delay time may be reduced to render it possible to deal with the high-speed operation. That is, in case plural stages of the logic circuits of the present invention are interconnected to form an ECC circuit, it is possible to achieve high-speed ECC processing operations.

Moreover, according to the present invention, the propagation delay time of output signals pertinent to respective transitions of plural input signals may become equal, owing to input signal path symmetry in the circuit, to render it possible to suppress the skew.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

A logic circuit according to a preferred embodiment of the present invention, comprises input terminals A and B, supplied with respective logic signals; and transistors NM1 and NM2 which have first signal terminals, such as sources, thereof connected to associated input terminals A and B respectively, and which have control terminals, such as gates thereof connected to the input terminals B and A, respectively, that is, to the input terminals different from the terminals to which the first signal terminals thereof are connected.

The logic circuit comprises further a first group of switches PM1 and PM2 which are connected in series between a first power supply VDD and a common node N1, and which have respective control terminals such as gates thereof supplied with signals from the input terminals B and A for being on-off controlled, a second group of switches NM4 and NM5 which are connected in series between an output terminal OUT and a second power supply GND and which have respective control terminals, such as gates thereof, supplied with the signals from the input terminals A and B for being on-off controlled, and a third group of switches PM4 and PM5 which are connected in parallel between a first power supply VDD and the power supply terminal of an inverter circuit made up of transistor PM3 and NM3 and which have respective control terminals, such as gates thereof, supplied with the signals from the input terminals A and B for being on-off controlled.

Figure 2:
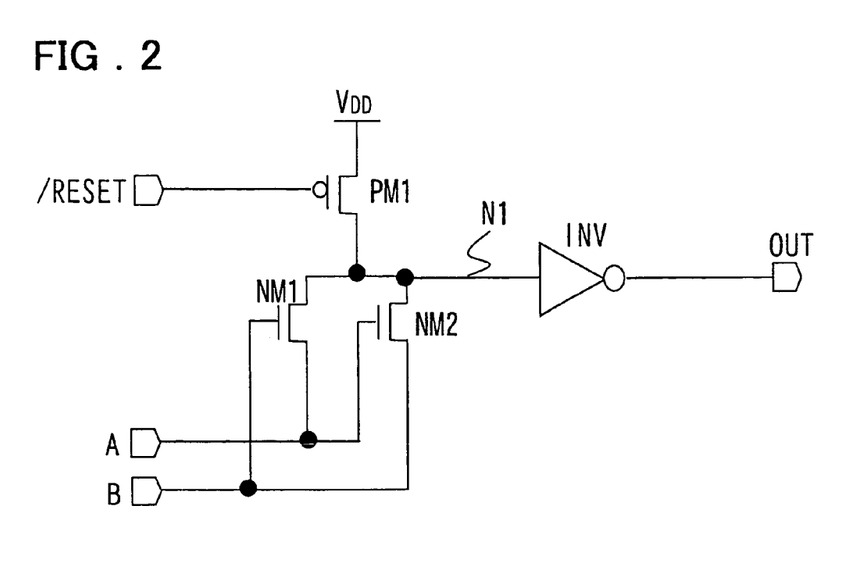
FIG. 2 is a diagram illustrating the configuration of a second embodiment of the present invention.

Referring to FIG. 2, the circuit according to another embodiment of the present invention, comprises input terminals A and B, supplied with respective logic signals; and transistors NM1 and NM2 which have first signal terminals, such as sources, thereof connected to associated input terminals A and B respectively, which have control terminals, such as gates thereof connected to the input terminals B and A, respectively, and which have the second signal terminals, such as drains thereof connected in common to a node N1 (termed as a common node N1). The common node N1 is connected to the first power supply VDD via a transistor PM1 which has a control terminal thereof supplied with a signal RESET for being on-off controlled. There is also provided an inverting circuit INV which has an input terminal thereof connected to the common node N1 and has an output end thereof connected to an output terminal OUT. A non-inverting circuit may be provided in place of the inverting circuit INV depending on the logic type used.

Figure 4:
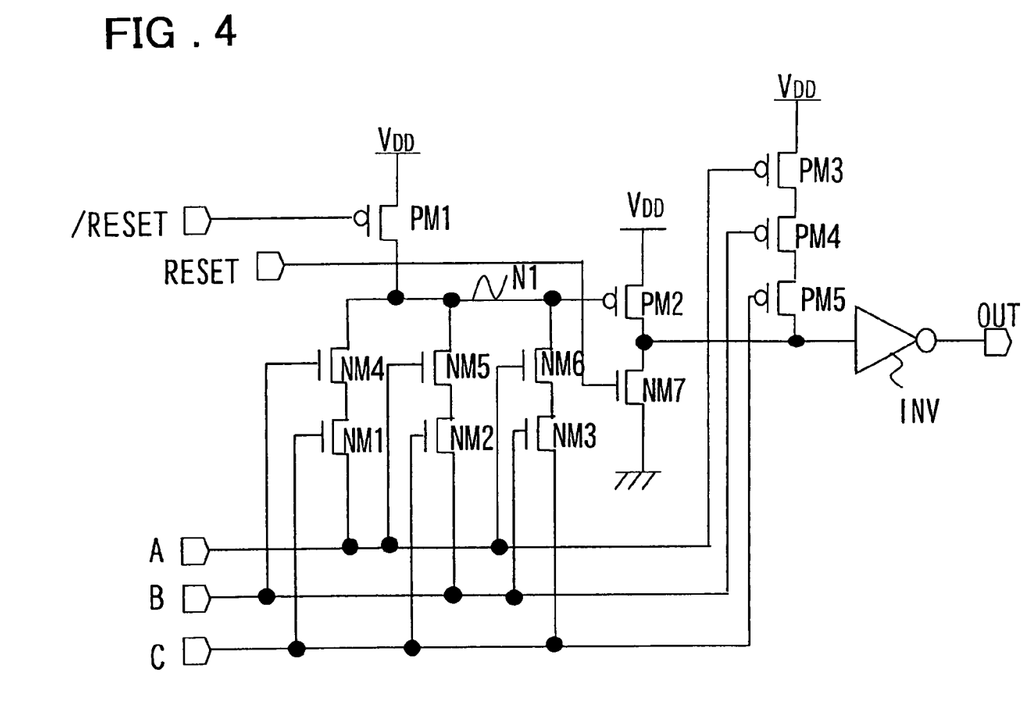
FIG. 4 is a diagram illustrating the configuration of a third embodiment of the present invention.

Referring to FIG. 4, in the circuit according to a further embodiment of the present invention, there are provided input terminals A, B and C, supplied with respective logic signals, and transistors NM1, NM2 and NM3, which have first signal terminals, such as sources thereof connected to the input terminals A, B and C, respectively, and also have control terminals, such as gates thereof connected to the input terminals C, C, and B, different from the input terminals to which the first signal terminals thereof are connected. The second signal terminals such as drains of the transistors NM1, NM2 and NM3 are connected to the common node N1 via further transistors NM4, NM5 and NM6, respectively. The further transistors NM4, NM5 and NM6 have the control terminals such as gates thereof connected respectively to the input terminals B, A and A different from the input terminals to which are connected the first signal terminals of the transistors NM1, NM2 and NM3 corresponding to the further transistors NM4, NM5 and NM6, respectively. There is also provided a switch PM1 which has a control terminal thereof supplied with a reset signal /RESET for being on-off controlled. There are also provided two complementary transistors PM2 and NM7, connected in series between the first power supply VDD and the second power supply GND. The control terminals, such as gates of the two complementary transistors PM2 and NM7 are connected to the common node N1 and to a terminal RESET supplied with a signal complementary to the reset signal /RESET, respectively. There are also provided switches PM3, PM4 and PM5, which are connected in series between the first power supply VDD and the connection node between the two complementary transistors PM2 and NM7. The switches PM3, PM4 and PM5 have control terminals such as gates thereof supplied with signals from the input terminals A, B and C, respectively, for being on-off controlled. There is provided, in addition, an inverting circuit having an input end connected to a connection node between the complementary transistors PM2 and NM7 and having an output end connected to an output terminal OUT. Certain preferred embodiments of the present invention will now be described in detail.

EMBODIMENTS

Figure 1:
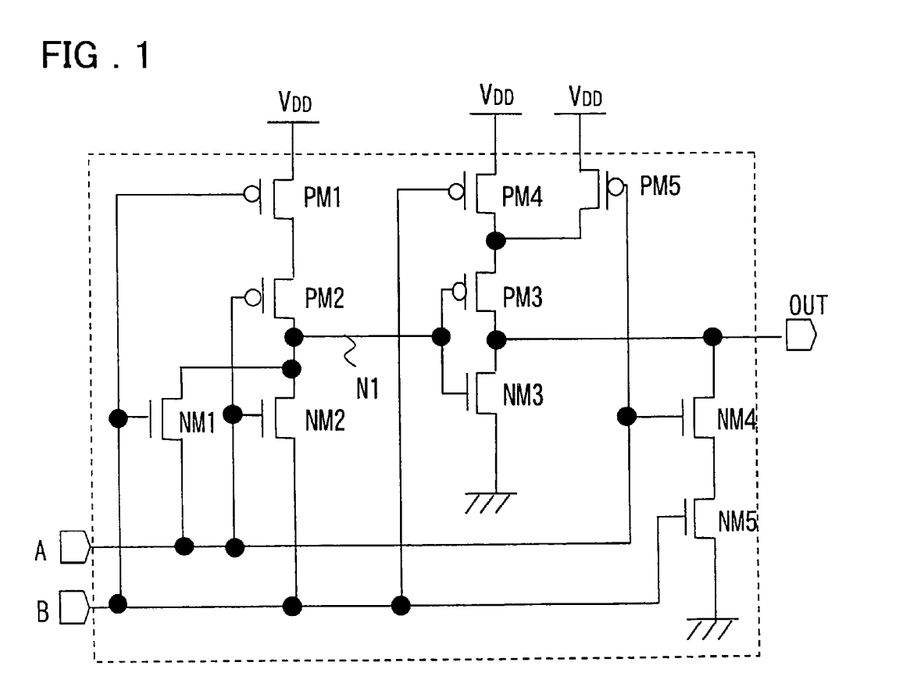
FIG. 1 is a diagram illustrating the configuration of a first embodiment of the present invention.

FIG. 1 shows the configuration of a logic circuit according to a first embodiment of the present invention. Referring to FIG. 1, a logic circuit according to the first embodiment of the present invention comprises input terminals A and B, supplied with respective logic signals, and nMOS transistors NM1 and NM2, having sources respectively connected to the input terminals A and B, and having gates cross-connected to the output terminals B and A. The drains of the nMOS transistors NM1 and NM2 are connected in common. The logic circuit according to the present embodiment further comprises pMOS transistors PM1 and PM2, connected in series between the power supply VDD and a node N1, to which the drains of the nMOS transistors NM1 and NM2 are connected in common (also termed a common node). The gates of the pMOS transistors PM1 and PM2 are connected to the input terminals B and A, respectively. The logic present according the present embodiment further comprises an inverter composed of an nMOS transistor NM3, having a source connected to the ground, and a pMOS transistor PM3, having a drain connected to the drain of the nMOS transistor NM3 and a gate connected, along with the gate of the nMOS transistor NM3, to the common node N1. The logic circuit according to the present first embodiment further comprises pMOS transistors PM4 and PM5, connected in parallel between the source of the pMOS transistor PM3 and the power supply VDD and having gates connected to the input terminals B and A respectively, and nMOS transistors NM4 and NM5 connected in series between an output terminal OUT and the ground GND and having gates connected to the input terminals A and B. The gates of the pMOS transistors PM1 and PM2 may also be connected to the input terminals A and B, respectively. Meanwhile, the pMOS transistors PM4 and PM5 may also have gates thereof connected to the input terminals A and B, respectively. The operation of the circuit of FIG. 1 will now be described.

When both the terminals A and B are at a low level, the pMOS transistors PM1 and PM2 and the pMOS transistors PM4 and PM5 are in an on state and the nMOS transistors NM1 and NM2, NM4 and NM5 are in an off state. Hence the voltage of the common node N1 supplied to the inverter composed by the transistors PM3 and NM3, becomes equal to the power supply voltage VDD, so that the output terminal OUT is at a low level.

When the terminal A is at a low level, and the terminal B is at a high level, the pMOS transistors PM1 and PM4 and the nMOS transistor NM2 are in an off state and the nMOS transistor NM1 is in an on state. Hence, the voltage of the common node N1 supplied to the inverter composed by the transistors PM3 and NM3, is at a low level so that the output terminal OUT is at a high level.

When the terminal A is at a high level, and the terminal B is at a low level, the pMOS transistors PM2 and PM5 and the nMOS transistor NM2 are in an on state, while the voltage of the common node N1 supplied to the inverter composed by the transistors PM3 and NM3, is at a low level so that the output terminal OUT is at a high level.

When the terminal A is at a high level and the terminal B is at a high level, the pMOS transistors PM1 and PM2, PM4 and PM5 are in an off state, while the nMOS transistors NM4 and NM5 are in an on state, so that the output terminal OUT is at a low level.

Thus, the logic circuit according to the present embodiment, in which the output terminal OUT is at a low level and at a high level, when the terminals A and B are at the same logic level and at different logic levels, respectively, operates as an exclusive-OR circuit (coincidence detection circuit). When the terminals A and B are both at a low level, the common node N1 is reset to a high level, thus initializing the common node N1.

In the present embodiment, unlike the circuit of FIG. 6, there is no transfer gate (pass-transistor) present, between the input terminal and the output terminal, which is set to an on state, so that, even if there are provided plural stages of the exclusive-OR circuits, the plural stages of the exclusive-OR circuits have no opportunity for appearing as loads to the input terminal side of the first stage.

In the present embodiment, the circuit is symmetrical in configuration with respect to the signals at the terminals A and B, such that is prohibited that the propagation delay time shall become different responsive to respective transitions of the signals at the terminals A and B. That is, the propagation delay time from the rise timing of the input signal at the terminal A to rising transition of the output signal at the output terminal OUT when the voltage at the terminal A rises to a high level, beginning from the state the terminals A and B are both at a low level, is equal to the propagation delay time from the rise timing of the input signal at the terminal B to rising transition of the output signal at the output terminal OUT when the voltage at the terminal B rises to a high level. When both the terminals A and B go to a high level, the output terminal OUT is set to a low level through the nMOS transistors NM4 and NM5, connected in series between the output terminal OUT and the ground, so that the delay time may be reduced.

FIG. 2 is a diagram showing the configuration of another embodiment of the present invention. Referring to FIG. 2, the logic circuit according to the present embodiment comprises nMOS transistors NM1 and NM2, having sources connected to the input terminals A and B, respectively, having gates cross-connected to the output terminals B and A, respectively, and having drains connected in common to a node N1 (termed a common node N1). In the logic circuit according to the present embodiment, there are also provided a PMOS transistor PM1 and an inverter INV having its input terminal connected to the common node N1. The pMOS transistor PM1 has a source connected to the power supply VDD, having a drain connected to the common node N1, and having a gate supplied with a reset signal /RESET. The pMOS transistor PM1 is turned on at the time of resetting. The symbol "/" in the reset signal /RESET means that the logic state is active at a low level. There may be provided a non-inverting circuit, in place of the inverting circuit INV, depending on the logic function to be performed by the logic circuit. The operation of the circuit shown in FIG. 2 will now be described.

The pMOS transistor PM1 is turned on, during a low level period of the reset signal /RESET, supplied e.g. in a one-shot pulse wave form, as the terminals A and B are both at the same level, such as low level, by way of initialization. The common node N1 is charged from the power supply VDD, via the pMOS transistor PM1 which is in an on state, and is set to a high level. This high level voltage is inverted by the inverter INV, which receives the voltage at the common node N1. Thus, the output terminal OUT is set to a low level. When next the reset signal /RESET is changed from a low level to a high level, the common node N1 is set to a floating state. The common node N1 retains the electric charge charged thereto. The output terminal OUT is held at a low level by the inverter INV.

When, in case the reset signal /RESET is at a high level and the common node N1 has been charged to a high level, the terminals A and B are both at a low level, the nMOS transistors NM1 and NM2 are both turned off, because the gate-to-source voltages VGS of each of these nMOS transistors is 0V. Hence, the common node N1 is in a high level, so that the output terminal OUT is set to a low level by the inverter INV.

When, in case the reset signal /RESET is at a high level and the common node N1 has been charged to a high level, the terminal A is at a low level and the terminal B is at a high level, the nMOS transistor NM1 is turned on. Hence, the common node N1 becomes low so that the output terminal OUT is set to a high level by the inverter INV.

When, in case the reset signal /RESET is at a high level and the common node N1 has been charged to a high level, the terminal A is at a high level and the terminal B is at a low level, the nMOS transistor NM2 is turned on. Hence, the common node N1 rises to a low level, so that the output terminal OUT is set to a high level by the inverter INV.

When, in case the reset signal /RESET is at a high level and the common node N1 has been charged to a high level, the terminal A is at a high level and the terminal B is at a low level, the nMOS transistors NM1 and NM2 are both turned off, because the gate-to-source voltages VGS of each of these nMOS transistors is 0V which is lower than the threshold voltage. The common node N1 is at a high level, so that the output terminal OUT is set to a low level by the inverter INV. In this manner, the configuration shown in FIG. 2 also forms an exclusive-OR circuit.

In the logic circuit according to the present embodiment, the propagation delay time from the rise of the signal voltage at the terminal A to the rise of the output voltage OUT, with the terminal B remaining fixed at a low level, is identical with that from the rise of the signal voltage at the terminal B to the rise of the output voltage OUT, with the terminal A remaining fixed at a low level, owing to signal path symmetry. This reduces the skew to zero.

Figure 3:
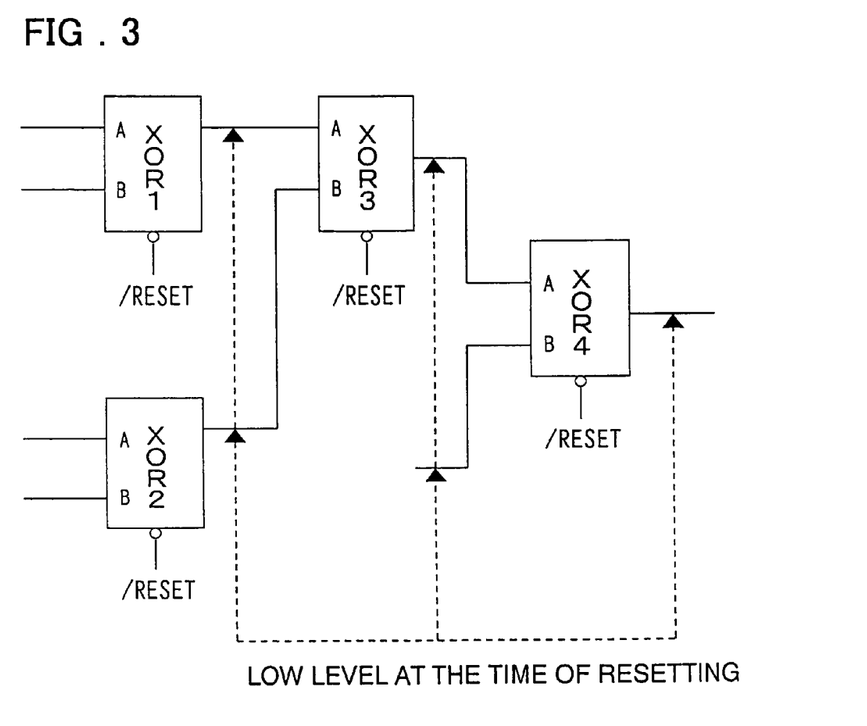
FIG. 3 is a diagram illustrating the configuration provided with plural circuits of FIG. 2.

FIG. 3 is a diagram illustrating the configuration, in which plural stages of exclusive-OR circuits, each of which is shown in FIG. 2 are arrayed in cascade connection. When the reset signal /RESET, supplied to the plural exclusive-OR circuits XOR1 to XOR4, transitions from a high level to a low level, the outputs of the respective exclusive-OR circuits become low. For example, when the output of the exclusive-OR circuit XOR3, receiving the outputs of the exclusive-OR circuits XOR1 and XOR2, becomes low, responsive to the reset signal /RESET (low level one-shot pulse), the output of the exclusive-OR circuit XOR3 is fixed at a low level, at the time of resetting. This is because the outputs of the exclusive-OR circuits XOR1 and XOR2, receiving the low-level reset signal /RESET, are both at a low level. That is, the outputs of the exclusive-OR circuits of the respective stages are all fixed at a low level. Meanwhile, the input terminals A and B of the exclusive-OR circuits XOR1 and XOR2 at the leftmost end of FIG. 3 are set to a low level or to a high level when the reset signal /RESET is at a low level (at the time of resetting). This control may be implemented by the configuration in which the connection destination of the input terminals A and B of the exclusive-OR circuits XOR1, XOR2 is switched to the ground or to the input signal based on the reset signal /RESET.

The logic circuits shown in FIGS. 1 and 2 are in keeping with the demand for high-speed operation to suppress the skew, and may suitably be adopted for an ECC circuit mounted on e.g. a memory circuit. In particular, the circuit configuration shown in FIG. 2, with the smaller number of components, may be used with advantage for an on-chip ECC circuit (encoding circuit or decoding circuit).

FIG. 4 is a diagram showing the configuration of a three-input even (even/odd) detection circuit according to a further embodiment of the present invention. Referring to FIG. 4, the circuit according to the present embodiment, comprises nMOS transistors NM1, NM2 and NM3, having sources connected to the input terminals A, B and C, respectively, and having gates connected to the output terminals C, C and B, respectively, and nMOS transistors NM4, NM5 and NM6, having sources connected to the drains of the nMOS transistors NM1, NM2 and NM3, respectively, and having gates connected to the input terminals B, A and A, respectively. The drains of the nMOS transistors NM4, NM5 and NM6 are connected in common to a node (termed a common node) N1. The present circuit also includes a PMOS transistor PM1, having a source, a drain and a gate connected to the power supply VDD, the common node N1 and to the reset terminal /RESET, respectively, a pMOS transistor PM2, having a source and a gate connected to the nMOS transistor NM7 having a source, a drain and a gate connected to the ground, to the drain of the pMOS transistor PM2 and to the reset terminal RESET (RESET is indicative of a signal complementary to /RESET). The circuit according to the present embodiment further comprises pMOS transistors PM3, PM4 and PM5, connected in series between the power supply VDD and the connection nodes between the drain of the pMOS transistor PM2 and the drain of the nMOS transistor NM7 and having gates connected to the input terminals A, B and C, respectively, and an inverter INV having its input end connected to the connection node between the drain of the pMOS transistor PM2 and the drain of the nMOS transistor NM7. Instead of providing the reset terminal RESET, a signal obtained on inverting a signal from the reset terminal /RESET by an inverter not shown, may as a matter of course be supplied to the gate of the nMOS transistor NM7. The operation of the circuit of FIG. 4 will now be described The reset signal /RESET is set to a low level and the signal RESET is set to a high level. In this case, the common node N1 is set to a high level, the pMOS transistor PM2 is turned off and the nMOS transistor NM7 is turned on. The output terminal OUT is set to a high level by the inverter INV.

In the following, it is assumed that the reset signal /RESET is at a low level, and that resetting has been done, that is, that the signal RESET is at a high level and the signal RESET is at a low level.

When the terminals A to C are all at a low level, the pMOS transistors PM3, PM4 and PM5 are turned on, and the pMOS transistor PM1 and the nMOS transistors NM1 to NM7 are turned off. In this case, the voltage of an input node of the inverter INV is high and the output terminal OUT is set to a low level.

When the terminals A, B and C are low, high and low respectively, the nMOS transistors NM1 and NM4 are turned on, the NMOS transistors NM2, NM3 and NM5 to NM7 are turned off, and the common node N1 is set to a low level. In this case, the pMOS transistor PM2 is turned on and the voltage of the input node of the inverter INV becomes high, as a result of which the output terminal OUT is set to a low level.

When the terminals A, B and C are high, low and high, respectively, the nMOS transistors NM2 and NM5 are turned on, the NMOS transistors NM1, NM3, NM4, NM6 and NM7 are turned off, and the common node N1 becomes low. In this case, the pMOS transistor PM2 is turned on and the voltage of the input node of the inverter INV becomes high, as a result of which the output terminal OUT is set to a low level.

When the terminals A, B and C are high, high and high, respectively, the nMOS transistors NM3 and NM6 are turned on, the NMOS transistors NM1 and NM2, NM4, NM5 and NM7 are turned off, and the common node N1 becomes low. In this case, the pMOS transistor PM2 is turned on and the voltage of the input node of the inverter INV becomes high, as a result of which the output terminal OUT is set to a low level.

When the terminals A, B and C are all high, the nMOS transistors NM1 to NM6 are turned off, the pMOS transistors PM3 to PM5 are turned off, the nMOS transistor NM7 is turned on and the voltage of the input node of the inverter INV becomes low, as a result of which the output terminal OUT is set to a high level.

When the terminals A, B and C are low, low and high, respectively, the nMOS transistors NM1 to NM6 are turned off, the common node N1 is set to a high level, the pMOS transistor PM2 is turned off, and the nMOS transistor NM7 is also turned off. The input node of the inverter INV is supplied with the voltage of the drain of the pMOS transistor PM2 and that of the drain of the nMOS transistor NM7 at the resetting time, so that the output terminal OUT is set to a high level. In similar manner, a high level is output to the output terminal OUT in case the levels of the terminals A to C are low, high and low, respectively, or high, low and low, respectively.

That is, the circuit shown in FIG. 4 is an even decision circuit outputting a low level in case there are an even number (zero or two) of a high level input terminals, out of the combinations of three inputs A to C, and outputting a high level otherwise, that is, in case there are an odd number of a high level input terminals. Meanwhile, the circuit of FIG. 4 may be used as an even/odd check circuit for deciding whether an even number of '1's or an odd number of '1's are contained in read data from the memory or in a received word.

Figure 5:
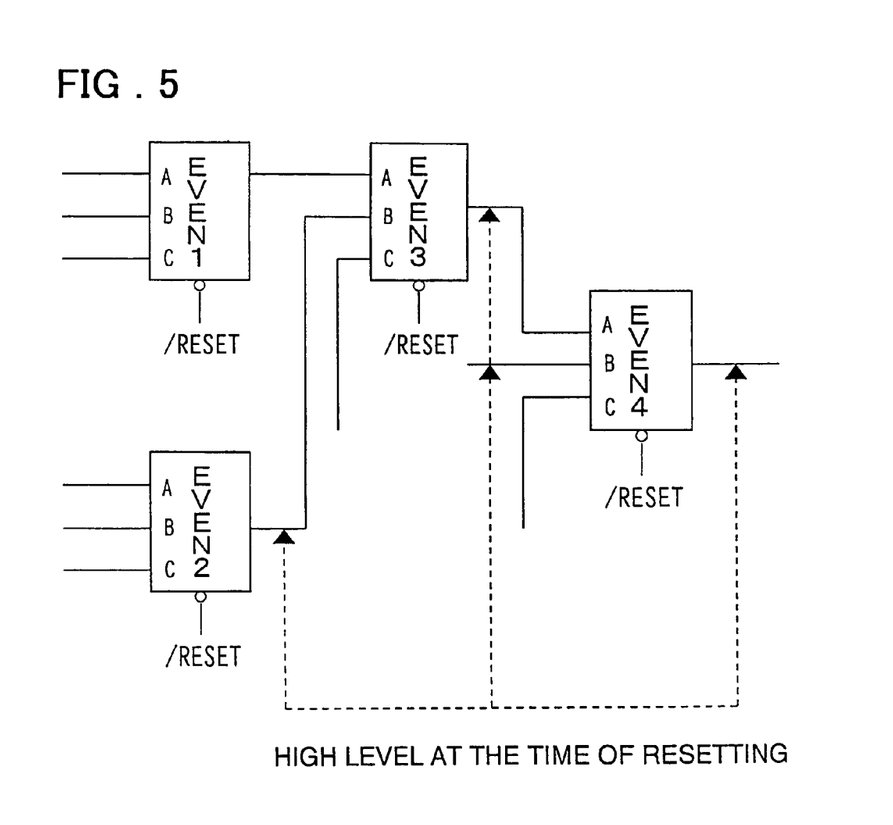
FIG. 5 is a diagram illustrating the configuration provided with a plural number of the circuits of FIG. 4.

FIG. 5 shows the configuration composed of plural stages of the circuits of FIG. 4. In FIG. 5, circuits EVEN1 to EVEN4 of FIG. 5 are each composed by a three-input even number decision circuit shown in FIG. 4. In case the reset signal /RESET is set to a low level (the signal RESET being high), the circuits EVEN1 to EVEN4 are reset to output a high level. For example, when the output of the even number decision circuit EVEN3 is set to a low level, by the reset signal /RESET of a low level (one-shot pulse), the outputs of the previous stages EVEN1, EVEN2 and so forth are all high, and hence the output of the even number decision circuit EVEN3, receiving the outputs of these previous stages EVEN1, EVEN2 and so forth, is fixed at a high level at the time of resetting. Meanwhile, the three input terminals A to C of the leftmost even number decision circuits EVEN1 and EVEN2 are fixed at a low level or at a high level at the time of resetting when no signal is supplied. This control may be implemented by a changeover switch configured for switching the destination of connection of the input terminals A to C of the even number decision circuits EVEN1 and EVEN2 to the ground or to the input signal based on the reset signal /RESET.

In the above-described embodiments, the logic circuit made up by CMOS circuits, composed of nMOS transistors and pMOS transistors, is taken as an example. However, the switches/transistors may, of course, be made up by bipolar transistors.

Although the present invention has been described with reference to the above-described embodiments, it is to be noted that the present invention is not limited to the above embodiments and that various changes or corrections that will be apparent to those skilled in the art are to be comprised within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A logic circuit comprising:
   first and second input terminals for receiving logic signals, respectively; and
   first and second transistors, each having a first signal terminal, a first control terminal and a second signal terminal, and
   a switch connected between a node and first power supply, said switch being ON-OFF controlled based on a signal supplied to a control terminal thereof,
   wherein said first signal terminal of said first transistor and said first control terminal of said second transistor are coupled to said first input terminal,
   wherein said first signal terminal of said second transistor and said first control terminal of said first transistor are coupled to said second input terminal, and
   wherein said second signal terminals are coupled to said node when said switch is ON and OFF.

2. A logic circuit comprising:
   a plurality of input terminals for receiving logic signals, respectively; and
   a plurality of transistors, each having a first signal terminal thereof connected to an associated one of said plurality of input terminals and having a control terminal thereof connected to one of said plurality of input terminals different from the input terminal to which said first signal terminal is connected, wherein second signal terminals of said plurality of transistors are connected to a node, either directly or through a further transistor;
   a switch connected between said node and a first power supply, said switch being on-off controlled based on a signal supplied to a control terminal thereof; and
   an inverting circuit having an input end connected to said node and having an output end connected to an output terminal of said logic circuit, said inverting circuit outputting a logic signal obtained on inverting the logic value at the input end.

3. A logic circuit comprising:
   a plurality of input terminals for receiving logic signals, respectively; and
   a plurality of transistors, each having a first signal terminal thereof connected to an associated one of said plurality of input terminals and having a control terminal thereof connected to one of said plurality of input terminals different from the input terminal to which said first signal terminal is connected, wherein second signal terminals of said plurality of transistors is connected to a node either directly or through said further transistor;
   a first group of switches connected in series between a first power supply and said node, said first group of switches having control terminals supplied with signals from said input terminals respectively, for being on-off controlled.

4. The logic circuit according to claim 3, further comprising a second power supply and a second group of switches connected in series between said output terminal and said second power supply, said second group of switches having control terminals supplied with signals from said input terminals respectively, for being on-off controlled.

5. The logic circuit according to claim 4, further comprising
   a third group of switches connected in parallel between the power supply side of said inverting circuit and said first power supply,
   said third group of switches having control terminals supplied with signals from said input terminals respectively for being on-off controlled.

6. A logic circuit comprising:
   first and second input terminals for receiving respective logic signals;
   first and second MOS transistors having sources connected to associated ones of said first and second input terminals, having gates cross-connected to said second and first input terminals and having drains connected in common to a node;
   third and fourth MOS transistors connected in series between said first power supply and said node and having gates connected respectively to said first and second input terminals;
   an inverter having an input end connected to said node; and
   fifth and sixth MOS transistors connected in parallel between the power supply of said inverter and said first power supply and having gates respectively connected to said first and second input terminals.

7. The logic circuit according to claim 6, wherein
   said third and fourth MOS transistors and said fifth and sixth MOS transistors are of opposite polarities with respect to said first and second MOS transistors.

8. The logic circuit according to claim 6, further comprising
   seventh and eighth MOS transistors connected in series between an output end of said inverter and said second power supply and having gates connected to said first and second input terminals;
   said seventh and eighth MOS transistors being turned on to set said output terminal to a logic level related to said second power supply when the signals of said first and second input terminals are of preset logic values.

* * * * *